(12) United States Patent
Toyoda

(10) Patent No.: US 9,214,578 B2
(45) Date of Patent: Dec. 15, 2015

(54) PHOTOELECTRIC CONVERSION APPARATUS

(71) Applicant: CANON KABUSHIKI KAISHA, Tokyo (JP)

(72) Inventor: Takehiro Toyoda, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 2 days.

(21) Appl. No.: 13/960,539

(22) Filed: Aug. 6, 2013

(65) Prior Publication Data

US 2014/0042576 A1   Feb. 13, 2014

(30) Foreign Application Priority Data

Aug. 8, 2012   (JP) .................................. 2012-176028

(51) Int. Cl.
   *H01L 31/0232*   (2014.01)
   *H01L 27/146*   (2006.01)

(52) U.S. Cl.
   CPC .... *H01L 31/02325* (2013.01); *H01L 27/14627* (2013.01); *H01L 27/14629* (2013.01)

(58) Field of Classification Search
   CPC .................. H01L 27/14627; H01L 31/02325; H01L 31/0232; H01L 33/58
   See application file for complete search history.

(56) References Cited

U.S. PATENT DOCUMENTS

| | | | |
|---|---|---|---|
| 2006/0151818 A1* | 7/2006 | Toumiya | 257/294 |
| 2007/0200056 A1 | 8/2007 | Kim et al. | |
| 2010/0165134 A1 | 7/2010 | Dowski, Jr. et al. | |
| 2010/0289939 A1* | 11/2010 | Ogino et al. | 348/340 |
| 2011/0277818 A1* | 11/2011 | Shimura | 136/246 |
| 2012/0200728 A1* | 8/2012 | Kobayashi et al. | 348/222.1 |

FOREIGN PATENT DOCUMENTS

| | | |
|---|---|---|
| CN | 101908550 A | 12/2010 |
| CN | 102446937 A | 5/2012 |
| CN | 102637704 A | 8/2012 |
| JP | H06-125070 A | 5/1994 |
| JP | 2000068491 A | 3/2000 |
| JP | 2005-260242 A | 9/2005 |
| JP | 2006120787 A | 5/2006 |
| JP | 2008192951 A | 8/2008 |

* cited by examiner

*Primary Examiner* — Whitney T Moore
(74) *Attorney, Agent, or Firm* — Canon USA Inc. IP Division

(57) ABSTRACT

A photoelectric conversion apparatus includes a lens array including a plurality of convex meniscus lenses. Each of the convex meniscus lenses is provided between a first member and a second member. The first member has a lower refractive index than each of the convex meniscus lenses and has convex surfaces conforming to respective concave surfaces of the convex meniscus lenses. The second member has a lower refractive index than each of the convex meniscus lenses and has concave surfaces conforming to respective convex surfaces of the convex meniscus lenses. The first member is provided between a group of the convex meniscus lenses and a group of the photoelectric conversion portions.

20 Claims, 11 Drawing Sheets

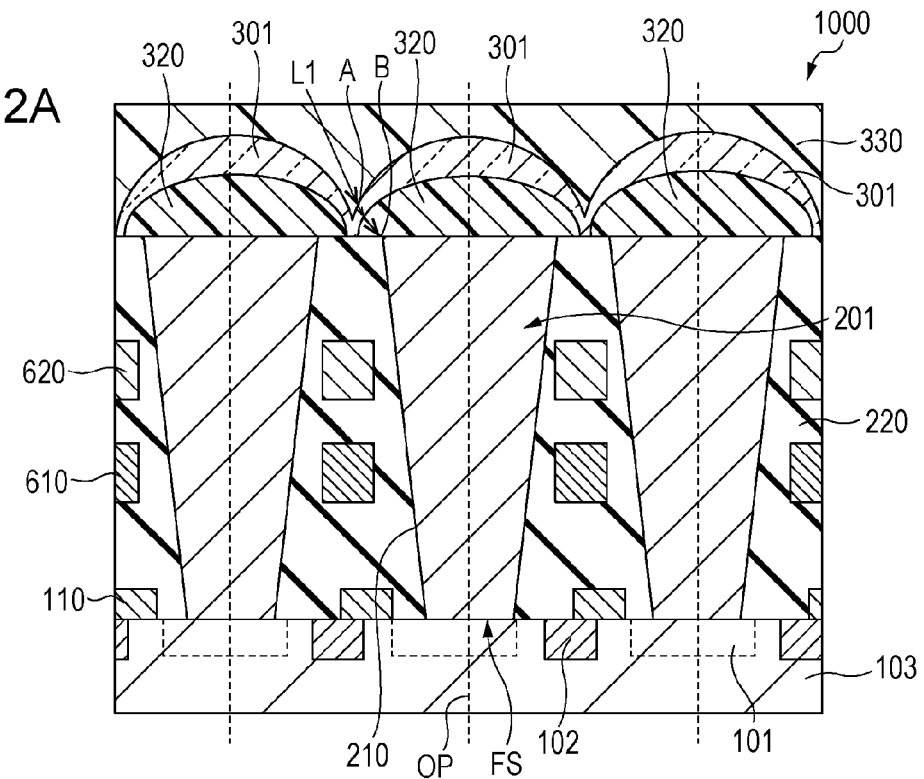
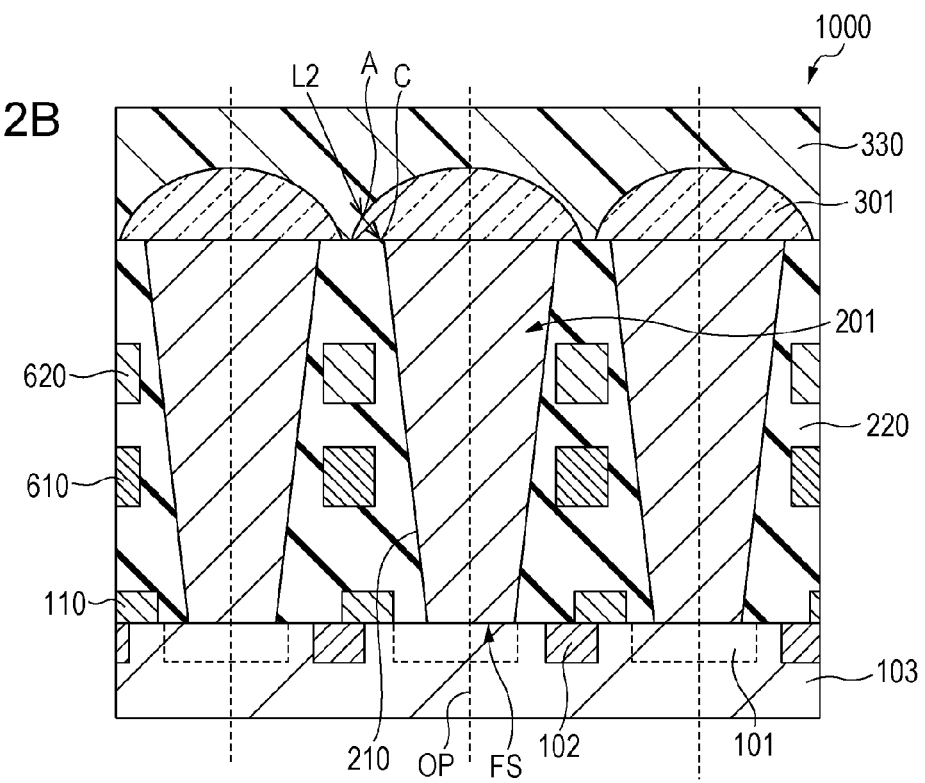

PHOTOELECTRIC CONVERSION APPARATUS

BACKGROUND OF THE INVENTION

1. Field of the Invention

The present invention relates to a photoelectric conversion apparatus including lenses.

2. Description of the Related Art

In an image pickup device such as a complementary-metal-oxide-semiconductor (CMOS) sensor or a charge-coupled-device (CCD) sensor, on-chip lenses (microlenses) are used for increasing light utilization efficiency. A plurality of on-chip lenses are arranged in correspondence with a plurality of photoelectric conversion portions, whereby a lens array is provided. Examples of such an on-chip lens include a top lens, an in-layer lens, and so forth.

Japanese Patent Laid-Open No. 2008-192951 discloses an apparatus including, as in-layer lenses, plano-convex lenses each having a convex surface on its incidence side and a planar surface on its emergence side. To suppress reflection at the interface between each in-layer lens and an optical waveguide (a second transparent film) as a medium provided on the emergence side of the in-layer lens, the ratio of the refractive index of the optical waveguide to the refractive index of the in-layer lens is set to 0.95 to 1.05.

If the refractive index of the medium provided on the emergence side of the in-layer lens is made sufficiently smaller than the refractive index of the in-layer lens, the reflectance at the emergence surface of the in-layer lens increases because of the difference in the refractive index between the in-layer lens and the medium provided on the emergence side of the in-layer lens. Hence, in a case where there is another interface having a yet different refractive index between the emergence surface and a corresponding one of photoelectric conversion portions, optical interference may occur because of the difference in the optical path length between, for example, a light beam that is transmitted through the emergence surface and the interface without being reflected by the emergence surface and the interface and a light beam that is transmitted through the emergence surface, is reflected by the interface and the emergence surface, and is transmitted through the interface. If the position (level) of the emergence surface or the interface varies among different photoelectric conversion portions, the intensity of interference also varies among the different photoelectric conversion portions. Consequently, a problem arises in that the intensity of signals obtained through photoelectric conversion varies among different photoelectric conversion portions even if light beams that enter different in-layer lenses have the same intensity. In contrast, if the difference in the refractive index between the in-layer lens and the medium on the emergence side of the in-layer lens is reduced as disclosed by Japanese Patent Laid-Open No. 2008-192951, it becomes difficult to guide light to a corresponding one of the photoelectric conversion portions, resulting in a reduction in light utilization efficiency.

SUMMARY OF THE INVENTION

The present invention provides a high-performance photoelectric conversion apparatus.

According to an aspect of the present invention, a photoelectric conversion apparatus includes a photoelectric conversion region having a plurality of photoelectric conversion portions, and a lens array provided above the photoelectric conversion region. The lens array includes a plurality of convex meniscus lenses. Each of the convex meniscus lenses is provided between a first member and a second member. The first member has a lower refractive index than each of the convex meniscus lenses and has convex surfaces conforming to respective concave surfaces of the convex meniscus lenses. The second member has a lower refractive index than each of the convex meniscus lenses and has concave surfaces conforming to respective convex surfaces of the convex meniscus lenses. The first member is provided between a group of the convex meniscus lenses and a group of the photoelectric conversion portions.

Further features of the present invention will become apparent from the following description of exemplary embodiments with reference to the attached drawings.

BRIEF DESCRIPTION OF THE DRAWINGS

FIG. 2A is a schematic sectional view illustrating another exemplary photoelectric conversion apparatus according to the first or second embodiment.

FIG. 2B is a schematic sectional view illustrating an exemplary photoelectric conversion apparatus according to a comparative embodiment.

DESCRIPTION OF THE EMBODIMENTS

Figure 1A:
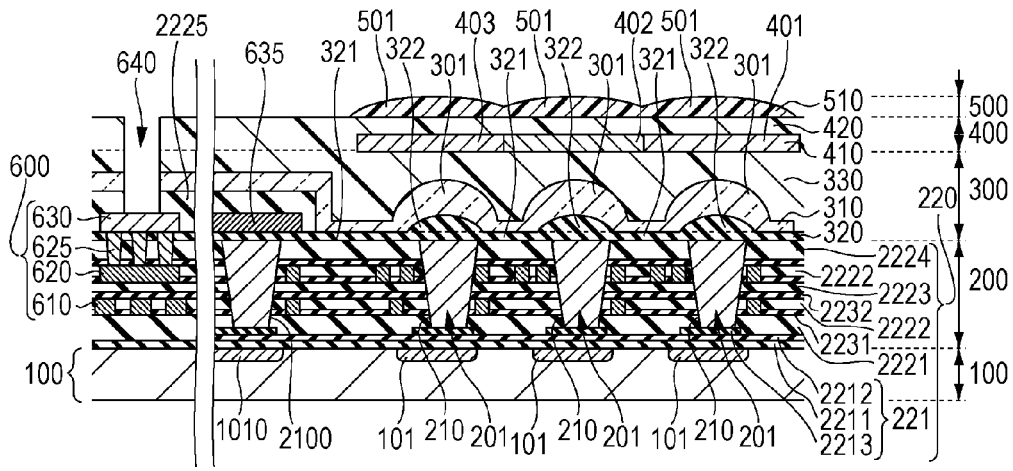
FIG. 1A is a schematic sectional view illustrating an exemplary photoelectric conversion apparatus according to a first embodiment.

Exemplary photoelectric conversion apparatuses will now be described with reference to the accompanying drawings, wherein like elements are denoted by like reference numerals, and redundant description thereof is omitted.

Figure 1B:
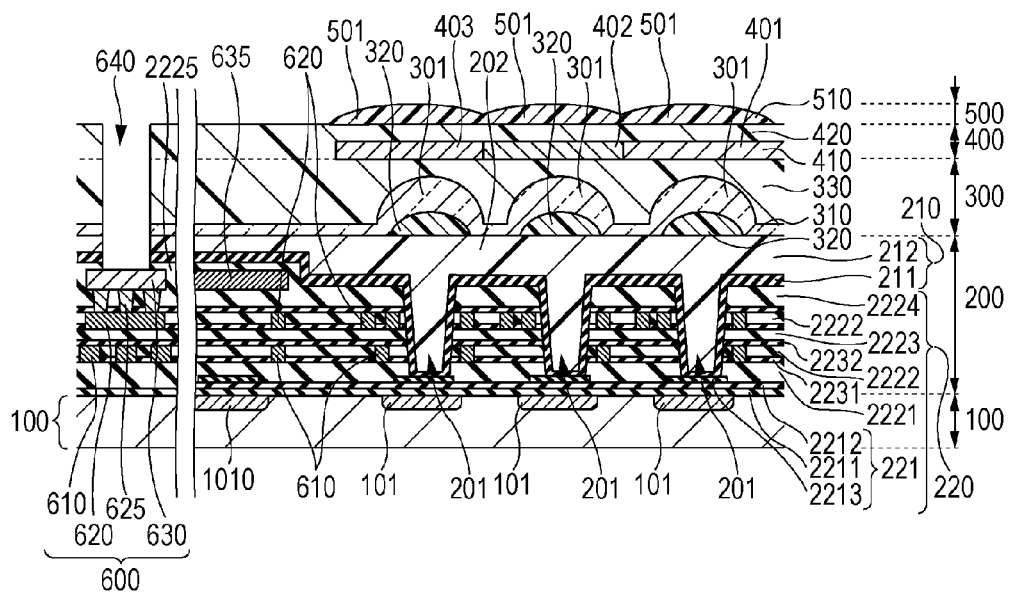
FIG. 1B is a schematic sectional view illustrating an exemplary photoelectric conversion apparatus according to a second embodiment.

FIG. 1A illustrates an exemplary photoelectric conversion apparatus according to a first embodiment. FIG. 1B illustrates an exemplary photoelectric conversion apparatus according to a second embodiment. Elements that are common to the first embodiment and the second embodiment will be described first.

A photoelectric conversion apparatus 1000 includes a photoelectric conversion unit 100, a light-guiding unit 200, a first light-condensing unit 300, a filter unit 400, a second light-condensing unit 500, and a metal structural body 600. The light-guiding unit 200 resides between the first light-condensing unit 300 and the photoelectric conversion unit 100. The first light-condensing unit 300 resides between the second light-condensing unit 500 and the photoelectric conversion unit 100. The filter unit 400 resides between the first light-condensing unit 300 and the second light-condensing unit 500.

The photoelectric conversion unit 100 includes a photoelectric conversion region having a plurality of photoelectric conversion portions 101. Each of the photoelectric conversion portions 101 provided in the photoelectric conversion region is, for example, a photodiode embedded in a semiconductor substrate. The photoelectric conversion portion 101 as a photodiode includes a semiconductor region of a first conductivity type and a semiconductor region of a second conductivity type. Signal charges of the first conductivity type generated through photoelectric conversion are collected in the semiconductor region of the first conductivity type included in the photoelectric conversion portion 101. If the signal charges are electrons, the first conductivity type corresponds to a negative type. The photoelectric conversion unit 100 further includes semiconductor elements (not illustrated). The semiconductor elements are each a metal-oxide-semiconductor (MOS) transistor, a MOS gate, or a charge-coupled device (CCD). The semiconductor elements transfer the signal charges generated by the photoelectric conversion portions 101, or generate electric signals from the signal charges. For example, in a MOS photoelectric conversion apparatus, the signal charges generated by the photoelectric conversion portions 101 are transferred to floating diffusion portions via transfer gates. The floating diffusion portions are connected to gates of amplifier transistors. Signals corresponding to gate voltages of the amplifier transistors are output from the amplifier transistors. The photoelectric conversion unit 100 may include a peripheral region in addition to the photoelectric conversion region. The peripheral region has a dummy photoelectric conversion portion 1010 that is shielded from light by a light-shielding member 635 so as to generate an optical black signal, a signal processing portion (not illustrated) that processes signals generated from signal charges, and a driving portion (not illustrated) that drives elements provided in the photoelectric conversion region. The signal processing portion and the driving portion are provided on the semiconductor substrate having the photoelectric conversion region.

The light-guiding unit 200 includes a plurality of light-guiding portions 201 each functioning as a light-guiding path (an optical waveguide), and a base portion 220 surrounding the light-guiding portions 201. The light-guiding portions 201 form one or a plurality of light-guiding members 210 (hereinafter described in the plural form unless otherwise stated) that transmit light. The light-guiding portions 201 each have any of a round column shape, a polygonal column shape, a circular truncated-cone shape, a polygonal truncated-cone shape, a circular cone shape, a polygonal cone shape, and the like.

In the first embodiment illustrated in FIG. 1A, a plurality of light-guiding members 210 that are separate from one another form the respective light-guiding portions 201. In the second embodiment illustrated in FIG. 1B, one light-guiding member 210 includes the plurality of light-guiding portions 201 and a connecting portion 202 that connect the light-guiding portions 201 with one another.

In principle, each light-guiding portion 201 guides light while totally or specularly reflecting the light. Total reflection tends to occur when the base portion 220 includes a layer (low-refractive-index layer) having a lower refractive index than the light-guiding members 210 or when a region (low-refractive-index region) having a lower refractive index than the light-guiding members 210 is provided between the base portion 220 and the light-guiding members 210. An air gap is an example of the low-refractive-index region. Specular reflection tends to occur when a metal film is provided between the base portion 220 and the light-guiding members 210. The configurations illustrated in FIGS. 1A and 1B both employ the principle of total reflection.

The light-guiding members 210 and the base portion 220 may each have a monolayer structure or a multilayer structure. The light-guiding members 210 illustrated in FIG. 1A each include only one layer. The light-guiding member 210 illustrated in FIG. 1B includes two layers. The light-guiding members 210 illustrated in FIG. 1A are made of silicon nitride. The light-guiding member 210 illustrated in FIG. 1B includes a silicon nitride layer 211 functioning as an outer layer of each light-guiding portion 201, and a resin layer 212 functioning as an inner layer of each light-guiding portion 201. In the light-guiding portion 201, if the refractive index of the outer layer is made higher than the refractive index of the inner layer, the amount of optical loss due to the leakage of light into the base portion 220 is reduced. The material for the resin layer 212 is not limited to genuine resin and may be polymer resin in which inorganic particles having a higher refractive index than resin are diffused through the resin. Exemplary materials include acrylic resin, polyimide, and a material in which titanium oxide particles are diffused through polyimide or siloxane resin. The refractive index of siloxane resin through which titanium oxide particles are diffused is 1.8 to 2.0, for example.

The base portion 220 illustrated in each of FIGS. 1A and 1B has a multilayer structure. The base portion 220 includes a protective film 221 that protects the photoelectric conversion unit 100. The protective film 221 is a multilayer film that includes a silicon nitride layer 2211, a silicon oxide layer 2212, and a silicon nitride layer 2213. The protective film 221 may also function as an anti-reflection film. The protective film 221 resides between the photoelectric conversion unit 100 and the light-guiding members 210. Alternatively, the protective film 221 may be omitted, and the light-guiding members 210 may be in contact with the photoelectric conversion unit 100. The base portion 220 further includes silicon oxide layers 2221, 2222, and 2223 and silicon nitride layers 2231 and 2232.

In each of the first and second embodiments, the base portion 220 includes the layer (low-refractive-index layer) having a lower refractive index than the light-guiding members 210, and the low-refractive-index layer is in contact with and surrounds the light-guiding members 210 and an interface is formed between the light-guiding members 210 and the low-refractive-index layer. The silicon oxide layers 2221, 2222, and 2223 function as low-refractive-index layers having lower refractive indices than the light-guiding members 210.

The following description is given on an assumption that silicon oxide has a refractive index of 1.40 or higher and below 1.60, silicon oxynitride has a refractive index of 1.60 or higher and below 1.80, and silicon nitride has a refractive index of 1.80 or higher and below 2.30. Note that the refractive index varies with the elemental composition ratio of the material, the density of the film, the type and amount of impurities, and so forth, and do not necessarily fall within the ranges given above. The refractive index of resin varies widely with the type of resin. If particles are diffused through resin, the effective refractive index may vary more widely.

The first light-condensing unit 300 includes an in-layer lens array 310 that includes a plurality of in-layer lenses 301. The in-layer lenses 301 are each a convex meniscus lens, which is a condenser lens having a concave surface and a convex surface, the convex surface having a larger curvature than the concave surface. The concave surface of each in-layer lens 301 in the form of a convex meniscus lens faces toward a corresponding one of the photoelectric conversion portions 101, and the convex surface of the in-layer lens 301 faces toward the other side. Light is incident on the convex surface of the in-layer lens 301 and emerges from the concave surface of the in-layer lens 301. The radius of curvature of the concave surface of the in-layer lens 301 is, for example, 1 µm or larger and 6 µm or smaller. The radius of curvature of the convex surface of the in-layer lens 301 is, for example, 0.5 µm or larger. In each of the first and second embodiments, the projected area of the convex surface of the in-layer lens 301 is larger than that of the concave surface of the in-layer lens 301. The term "projected area" refers to the area of a portion defined by the outline of a projection of the convex surface or the concave surface that is cast along the optical axis of the in-layer lens 301 onto a plane perpendicular to the optical axis. Typically, the optical axis is perpendicular to a light-receiving surface of the photoelectric conversion portion 101. In some cases, however, the optical axis may be angled with respect to the light-receiving surface of the photoelectric conversion portion 101. In each of the first and second embodiments, the projected area of the convex surface of the in-layer lens 301 is larger than the area of the entrance of the light-guiding portion 201. That is, when the in-layer lens 301 is projected onto the light-guiding unit 200, the outline of the convex surface of the in-layer lens 301 encloses the outline of the entrance of the light-guiding portion 201. The light-guiding portion 201 according to each of the first and second embodiments has a tapered shape that becomes narrower toward the photoelectric conversion portion 101. That is, the light-guiding portion 201 has largest diameter at the entrance thereof. Although the convex surfaces of adjacent ones of the in-layer lenses 301 according to each of the first and second embodiments are spaced apart from each other, the convex surfaces of adjacent ones of the in-layer lenses 301 may alternatively border each other. Although the concave surfaces of adjacent ones of the in-layer lenses 301 according to each of the first and second embodiments are spaced apart from each other, the concave surfaces of adjacent ones of the in-layer lenses 301 may alternatively border each other.

The first light-condensing unit 300 includes one or a plurality of convex members 320 (hereinafter described in the singular form unless otherwise stated) as a first member and a concave member 330 as a second member. The in-layer lenses 301 reside between the convex member 320 and the concave member 330. The in-layer lenses 301 reside between the concave member 330 and the photoelectric conversion unit 100. The convex member 320 resides between the photoelectric conversion unit 100 and the in-layer lenses 301.

The in-layer lenses 301 each have a higher refractive index than the convex member 320 and the concave member 330. The convex member 320 and the concave member 330 may have the same refractive index or different refractive indices. If the convex member 320 has a higher refractive index than the concave member 330, the diffusion of light is suppressed. The refractive index of the in-layer lenses 301 may be 1.70 or higher. The in-layer lenses 301, the convex members 320 and the concave member 330 may be made of solid body having a refractive index of more than 1.10.

In the first embodiment illustrated in FIG. 1A, the convex member 320 is made of silicon oxide, the in-layer lenses 301 are made of silicon nitride, and the concave member 330 is made of a resin having a refractive index of 1.40 to 1.70, or preferably 1.50 to 1.60. In the second embodiment illustrated in FIG. 1B, the convex members 320 are made of a resin having a refractive index of 1.40 to 1.70, or preferably 1.50 to 1.70, the in-layer lenses 301 are made of silicon nitride, and the concave member 330 is made of a resin having a refractive index of 1.40 to 1.70. The concave member 330 may alternatively be made of silicon oxide.

The convex member 320 has convex surfaces that conform to the respective concave surfaces of the in-layer lenses 301. In the first embodiment illustrated in FIG. 1A, the convex member 320 includes a plurality of convexities 322 having respective convex surfaces, and planar portions 321 connecting the convexities 322. In the second embodiment illustrated in FIG. 1B, a plurality of convex members 320 that are separate from one another have respective convex surfaces. The projected area of each convex surface of the convex member 320 tends to be equal to the projected area of the concave surface of a corresponding one of the in-layer lenses 301.

The concave member 330 has concave surfaces that conform to the respective convex surfaces of the in-layer lenses 301. In each of the first and second embodiments illustrated in FIGS. 1A and 1B, the concave member 330 is a continuous film having a plurality of concave surfaces that conform to the respective convex surfaces of the in-layer lenses 301. The concave member 330 in the form of a continuous film may alternatively be divided into a plurality of separate pieces provided for the respective in-layer lenses 301. In each of the first and second embodiments illustrated in FIGS. 1A and 1B, the concave member 330 has the plurality of concave surfaces and planar portions each interposed between adjacent ones of the concave surfaces. The planar portions may be omitted. The projected area of each of the concave surfaces of the concave member 330 tends to be equal to the projected area of the convex surface of a corresponding one of the in-layer lenses 301. In each of the first and second embodiments, a side of the concave member 330 opposite a side facing the in-layer lenses 301 is more planar than the side of the concave member 330 that faces the in-layer lenses 301. The concave member 330 functions as a planarizing film. The side of the concave member 330 opposite the side facing the in-layer lenses 301 may have convex surfaces that conform to the respective convex surfaces of the in-layer lenses 301.

The in-layer lens array 310 may be an integral film-like member (an in-layer lens film) including a plurality of in-layer lenses 301, or may be a group of separate members each including an in-layer lens 301. The in-layer lenses 301 may each have a multilayer structure that includes a plurality of layers having different refractive indices. That is, the in-layer lens array 310 may be a multilayer film. In that case, one of the plurality of layers of each in-layer lens 301 or the in-layer lens array 310 that is the nearest to the convex member 320 has a higher refractive index than the convex member 320, or one of the plurality of layers of the in-layer lens 301 or the in-layer lens array 310 that is the nearest to the concave member 330 has a higher refractive index than the concave member 330. A typical in-layer lens 301 having a multilayer structure includes the following three layers in order from the side thereof facing the convex member 320: a silicon oxynitride layer as a first sub-layer, a silicon nitride layer as a main layer, and a silicon oxynitride layer as a second sub-layer. The main layer is thicker than the sub-layers and has a higher refractive index than the sub-layers. If the sub-layers each have a refractive index that is between the refractive indices of the main layer and the convex member 320 or the concave member 330, the sub-layers function as anti-reflection layers.

The filter unit 400 includes a color filter array 410. The color filter array 410 includes red-light filters 401, green-light filters 402, and blue-light filters 403 that are arranged in a Bayer pattern. In each of the first and second embodiments illustrated in FIGS. 1A and 1B, the filters 401 to 403 having the three colors are arranged in L shapes in a two-by-two Bayer matrix pattern. The filters 401 to 403 are provided on the planar surface of the concave member 330 that is opposite the surface facing the in-layer lenses 301. The filter unit 400 further includes a coating 420 that covers the color filter array 410 and thus planarizes the color filter array 410.

The second light-condensing unit 500 includes a top lens array 510 including a plurality of top lenses 501. The top lenses 501 are arranged on the planar surface of the coating 420. In each of the first and second embodiments, convex surfaces of adjacent ones of the top lenses 501 border each other, whereby the top lens array 510 forms a gap-less lens array. That is, the diameter of each top lens 501 is equal to the pitch of the top lenses 501 (the distance between optical axes of adjacent ones of the top lenses 501). The top lenses 501 are made of resin such as styrene. The top lenses 501 are each a convex lens and may be any of a plano-convex lens, a biconvex lens, and a convex meniscus lens. In each of the first and second embodiments, the top lens 501 is a plano-convex lens. The curvature of the convex surface of the top lens 501 according to each of the first and second embodiments is smaller than the curvature of the convex surface of each in-layer lens 301.

In each of FIGS. 1A and 1B, the color filter array 410 and the top lens array 510 are provided only in an area corresponding to the photoelectric conversion region and are not present in an area corresponding to the peripheral region. In some cases, however, the color filter array 410 and the top lens array 510 may be provided also in the area corresponding to the peripheral region for some reasons concerning the manufacturing process or other factors.

The metal structural body 600 includes contact plugs (not illustrated), a first wire layer 610, a second wire layer 620, via plugs 625, and a metal layer 630 that are supported by the base portion 220. The metal layer 630 includes an electrode pad exposed in a pad opening 640, and the light-shielding member 635 that shields the dummy photoelectric conversion portion 1010 from light. The contact plugs and the via plugs 625 are chiefly made of tungsten. The first wire layer 610 and the second wire layer 620 are chiefly made of copper. The metal layer 630 is chiefly made of aluminum. The wire layers 610 and 620 and the metal layer 630 may each include a barrier metal. The first wire layer 610 is connected to the contact plugs. The second wire layer 620 is connected to the first wire layer 610 at a certain position (not illustrated). The metal layer 630 is connected to the second wire layer 620 via the via plugs 625. The numbers and materials of metal layers and wire layers to be provided are not limited to those given above. The silicon oxide layer 2221 resides between the first wire layer 610 and the photoelectric conversion unit 100 and at the same level as the contact plugs. The silicon oxide layer 2222 includes two layers. One of the two layers resides at the same level as the first wire layer 610, and the other resides at the same level as the second wire layer 620. The silicon oxide layer 2223 resides between the first wire layer 610 and the second wire layer 620 and at the same level as the via plugs 625 that connect the first wire layer 610 and the second wire layer 620. The silicon nitride layers 2231 and 2232 are provided for each of the first wire layer 610 and the second wire layer 620. The silicon nitride layer 2231 is provided on the lower side of a corresponding one of the wire layers 610 and 620. The silicon nitride layer 2232 is provided on the upper side of a corresponding one of the wire layers 610 and 620. At least the silicon nitride layer 2232 functions as a copper-diffusion-preventing layer.

The photoelectric conversion apparatus 1000 including the photoelectric conversion unit 100, the light-guiding unit 200, the first light-condensing unit 300, the filter unit 400, the second light-condensing unit 500, and the metal structural body 600 has been described above. At least any of the light-guiding unit 200, the filter unit 400, the second light-condensing unit 500, and the metal structural body 600 may be omitted, or the order of the foregoing elements may be changed. For example, the metal structural body 600 may be provided on a side of the photoelectric conversion unit 100 across from the first light-condensing unit 300, thereby providing a backlighting photoelectric conversion apparatus. For another example, the filter unit 400 may be provided between the first light-condensing unit 300 and the photoelectric conversion unit 100. For yet another example, the top lenses 501 of the second light-condensing unit 500 may each be a convex meniscus lens. In that case, the second light-condensing unit 500 may include a convex member having convex surfaces conforming to the respective concave surfaces of the top lenses 501, and a concave member having concave surfaces conforming to the respective convex surfaces of the top lenses 501. If the top lenses 501 each have a higher refractive index than the convex member and the concave member, the top lenses 501 are capable of condensing light. In such a case, the in-layer lenses 301 included in the first light-condensing unit 300 may each be a plano-convex lens, instead of being a convex meniscus lens, or the first light-condensing unit 300 may be omitted.

Figure 3A:
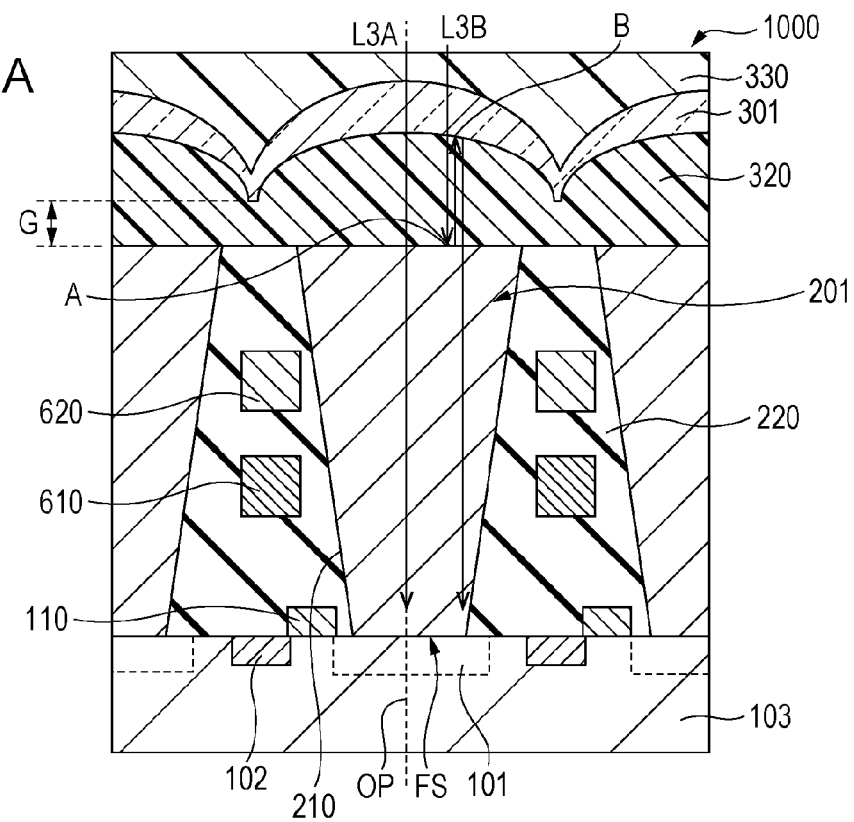
FIG. 3A is a schematic sectional view illustrating an exemplary photoelectric conversion apparatus according to the first or second embodiment.
Figure 3B:
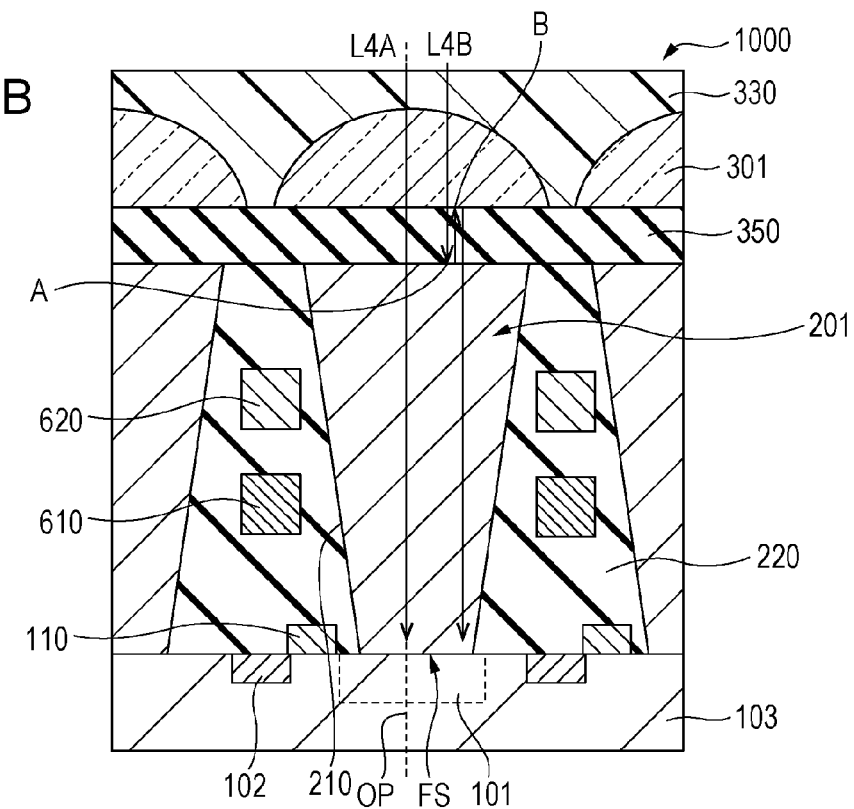
FIG. 3B is a schematic sectional view illustrating an exemplary photoelectric conversion apparatus according to the comparative embodiment.

FIGS. 2A, 2B, 3A, and 3B are enlarged sectional views illustrating the in-layer lenses 301 and peripheral elements according to either of the first and second embodiments and a comparative embodiment. FIGS. 2A and 3A each illustrate an exemplary case according to the first or second embodiment in which the in-layer lenses 301 are convex meniscus lenses. FIGS. 2B and 3B each illustrate a comparative embodiment in which the in-layer lenses 301 are plano-convex lenses. The convex surfaces of adjacent ones of the in-layer lenses 301 illustrated in FIGS. 2A and 3A border each other. The light-guiding members 210 and the in-layer lenses 301 are made of silicon nitride. The convex member 320, an intermediate member 350 (see FIG. 3B), and the base portion 220 are made of silicon oxide. The concave member 330 is made of a resin having a lower refractive index than the in-layer lenses 301. The photoelectric conversion unit 100 includes a semiconductor substrate 103, in which the photoelectric conversion portions 101 and floating diffusion portions 102 are provided. Furthermore, transfer gate electrodes 110 are provided on the semiconductor substrate 103.

In the comparative embodiment illustrated in FIG. 2B, light L2 that has entered one of the in-layer lenses 301 is refracted by the convex surface of the in-layer lens 301. Since there is no difference in the refractive index between the in-layer lenses 301 and the light-guiding members 210, the light L2 refracted by the convex surface is guided straight through a corresponding one of the light-guiding portions 201 and enters a corresponding one of the photoelectric conversion portions 101. In general, light that has entered the in-layer lens 301 tends to be incident on the light-receiving surface of the photoelectric conversion portion 101 at a large angle in a peripheral portion of the photoelectric conversion region. Such a tendency is pronounced at, for example, zooming positions near a wide-angle end of a zoom lens included in a camera. If the above angle of incidence becomes large, the following problems may arise. If no light-guiding portions 201 are provided, light may stray. Even in a case where the light-guiding portions 201 are provided, if the angle of incidence becomes larger than the critical angle for the light-guiding portions 201, for example, light might not be guided into the light-guiding portions 201. Moreover, if light is incident on one of the photoelectric conversion portions 101 at a large angle, the light may travel through the semiconductor substrate 103 obliquely with respect to the light-receiving surface and enter another unintended photoelectric conversion portion 101, where the light may undergo photoelectric conversion. Hence, if light in the form of a very narrow beam and traveling at an angle almost perpendicular to the light-guiding portion 201 and the photoelectric conversion portion 101 is incident on the light-guiding portion 201 and the photoelectric conversion portion 101, light utilization efficiency is improved. Light utilization efficiency is improved by providing the convex member 320 having a lower refractive index than the in-layer lenses 301 and the light-guiding members 210, as illustrated in FIGS. 2A and 3A.

An arrow L3A illustrated in FIG. 3A and an arrow L4A illustrated in FIG. 3B each represent a normal incident beam whose path coincides with an optical axis OP of one of the in-layer lenses 301. In each of the first and second embodiments, the optical axis OP is perpendicular to a light-receiving surface FS of a corresponding one of the photoelectric conversion portions 101. An arrow L3B illustrated in FIG. 3A and an arrow L4B illustrated in FIG. 3B each represent a beam that is incident on the in-layer lens 301 at a position slightly deviating from the optical axis OP. The beams each pass through the in-layer lens 301 and is incident on an interface A between the convex member 320 or the intermediate member 350 and the light-guiding member 210 having a higher refractive index than the convex member 320 or the intermediate member 350. The beams L3A and L4A are each transmitted through the interface A. The beams L3B and L4B are each reflected by the interface A. The beams L3B and L4B are each further reflected by an interface B between the convex member 320 or the intermediate member 350 and the in-layer lens 301 having a higher refractive index than the convex member 320 or the intermediate member 350, and then enter the light-guiding member 210. Here, a member having a higher refractive index than the convex member 320 and that is provided nearer to the photoelectric conversion portion 101 than a reflecting surface (the interface B) between the convex member 320 and the in-layer lens 301 and provides a reflecting surface (the interface A) causing the interference described above is defined as a third member. The light-guiding members 210 may each function as a third member having a higher refractive index than the convex member 320 or the intermediate member 350 and provided between the photoelectric conversion portion 101 and the convex member 320 or the intermediate member 350. In a case where no light-guiding members 210 are provided and the silicon oxide layers 2222, 2223, and 2224 and the silicon nitride layers 2231 and 2232 extend over the photoelectric conversion portions 101, the layers 2222, 2223, 2224, 2231, and 2232 in combination provide a reflecting surface corresponding to the interface A. In that case, the silicon nitride layers 2231 and 2232 in combination may function as a third member.

Letting the thickness of the intermediate member 350 (the distance between the interface A and the interface B) be D and the refractive index of the intermediate member 350 be n, the optical path length of the beam L4B reaching the light-receiving surface FS is longer than the optical path length of the beam L4A reaching the light-receiving surface FS by 2nD. At a wavelength λ satisfying a condition of $2nD=m_e\lambda/2$ (where $m_e$ is an even number, and λ denotes the wavelength of the incident beam), the beam L4A and the beam L4B interfere with each other and thus intensify each other. At a wavelength λ satisfying a condition of $2nD=m_o\lambda/2$ (where $m_o$ is an odd number, and λ denotes the wavelength of the incident beam), the beam L4A and the beam L4B interfere with each other and thus weaken each other. In this manner, the intensity of light is increased or decreased by interference in accordance with the wavelength. Accordingly, the difference in the intensity of light between beams at different wavelengths increases. Consequently, an image provided by the photoelectric conversion apparatus 1000 may contain nonuniformity in brightness or color. For example, possible wavelengths that may lead to color nonuniformity when n=1.6 and D=300 nm include 960 nm, 480 nm, 240 nm, etc. In a case where the beam L4B is intensified by being reflected four times and thus causing interference, possible wavelengths that may lead to color nonuniformity include 960 nm, 640 nm, 480 nm, 384 nm, etc. If different photoelectric conversion portions 101 have different thicknesses D because of errors or the like occurred in the manufacturing process, such photoelectric conversion portions 101 provide different levels of brightness even with color filters of the same color.

In contrast, in the first or second embodiment illustrated in FIG. 3A, since the interface B is a concave surface, the distance between the interface A and the interface B changes continuously. Reference character G in FIG. 3A is provided as a matter of convenience so as to indicate the position of the upper surfaces of the planar portions 321 included in the convex member 320, which also includes the convexities 322 connected to one another with the planar portions 321 and having the respective convex surfaces conforming to the respective concave surfaces of the in-layer lenses 301. Letting the height difference in each concave surface be d, the difference in the optical path length between the beams L3A and L3B passing through respective positions in the interface A ranges from 0 to 2nd. Such a configuration suppresses extreme intensification or weakening of beams at specific wavelengths in some of the photoelectric conversion portions 101. If 2nd is λ/2 or greater, the photoelectric conversion apparatus 1000 is completely practical. If 2nd is λ or greater, good improvement is provided to a configuration in which image quality tends to be reduced by the interference of light. Supposing that n=1.6 and λ=640 nm, 2nd≥λ/2 is satisfied when d≥100 nm, and 2nd≥λ is satisfied when d≥200 nm. Supposing that λ=480 nm, 2nd≥λ is satisfied when d≥150 nm. Supposing that the height difference in each convexity 322 is 200 nm or greater, not only red light at a wavelength of 640 nm but also blue light at a wavelength of 480 nm fully contributes to the suppression of the reduction in image quality caused by the interference of light. Consequently, the occurrence of interference pattern between the beam L3A and the beam L3B is suppressed. In the above description, as a matter of convenience, the direction in which light travels does not change before and after being reflected by the interface B. Practically, however, the direction of incidence on and the direction of reflection by the interface B, which is a concave surface, are different from each other. This also contributes to the suppression of the occurrence of interference of light caused by beams that travel in the same direction. Furthermore, since the beams reflected by the concave surfaces of the in-layer lenses 301 are made to converge, the occurrence of stray beams is suppressed.

An exemplary method of manufacturing the photoelectric conversion apparatus 1000 will now be described.

FIGS. 4A to 4H are sectional views illustrating a method of manufacturing the photoelectric conversion apparatus 1000 according to the first embodiment illustrated in FIG. 1A. FIGS. 5A to 5H are sectional views illustrating a method of manufacturing the photoelectric conversion apparatus 1000 according to the second embodiment illustrated in FIG. 1B.

Step A

Figure 4A:
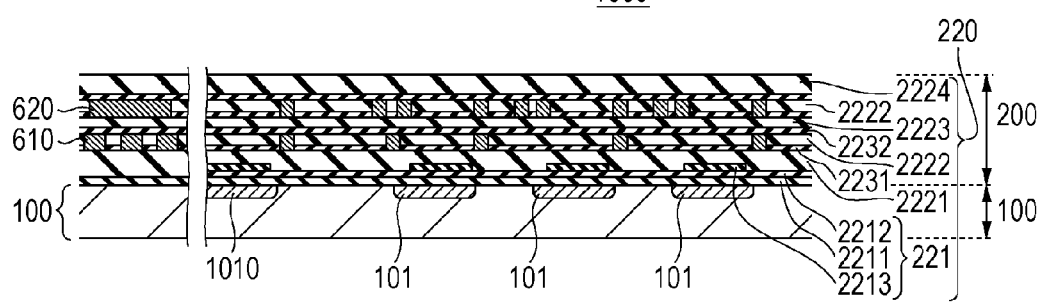
FIGS. 4A to 4H are schematic sectional views illustrating a method of manufacturing a photoelectric conversion apparatus according to the first embodiment.
Figure 5A:
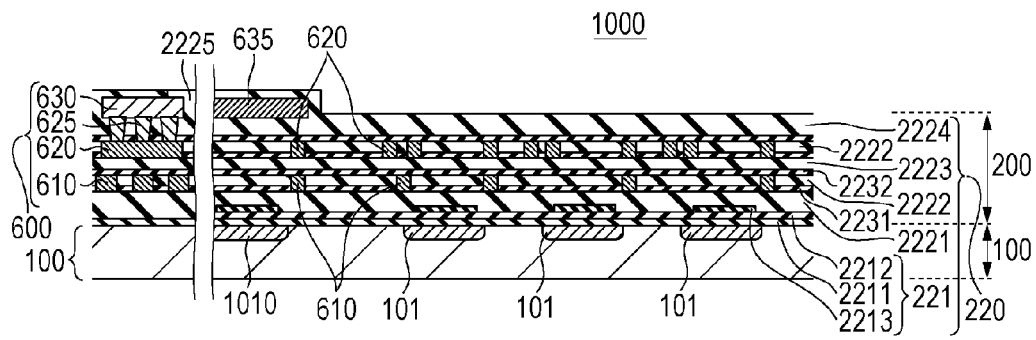
FIGS. 5A to 5H are schematic sectional views illustrating a method of manufacturing a photoelectric conversion apparatus according to the second embodiment.

FIGS. 4A and 5A each illustrate step A. In step A, a photoelectric conversion unit 100 and a base portion 220 that is included in a light-guiding unit 200 are formed.

First, a photoelectric conversion unit 100 is fabricated. The photoelectric conversion unit 100 can be fabricated through known semiconductor front-end processes. Subsequently, a protective film 221 is formed on the photoelectric conversion unit 100. Furthermore, a silicon nitride layer 2211, a silicon oxide layer 2212, and a silicon nitride layer 2213 are formed one on top of another over the entirety of the photoelectric conversion region, and the silicon nitride layer 2213 is patterned in correspondence with the pattern of the photoelectric conversion portions 101. The silicon nitride layer 2213 is formed by, for example, thermal chemical vapor deposition (CVD) at a substrate temperature of 500° C. to 700° C. and at a gas pressure of 10 Torr to 50 Torr.

Subsequently, contact plugs, wire layers, and via plugs are formed through known semiconductor back-end processes. For example, a first wire layer 610 is formed through a single damascene process. A second wire layer 620 is formed through a dual damascene process, whereby wires and via plugs are formed simultaneously. Silicon oxide layers 2221, 2222, 2223, and 2224 function as interlayer insulating films. A silicon nitride layer 2231 functions as an etching stop layer when trenches are formed. A silicon nitride layer 2232 functions as a copper-diffusion-preventing layer. The above layers in combination form a base portion 220.

In the second embodiment illustrated in FIG. 5A, via holes extending through the silicon oxide layer 2224 and the silicon nitride layer 2232 and reaching the second wire layer 620 are provided, and via plugs 625 are embedded in the respective via holes. Subsequently, a metal layer 630 to be connected to the via plugs 625 is formed on the silicon oxide layer 2224. Simultaneously, a light-shielding member 635 is formed over the dummy photoelectric conversion portion 1010. Furthermore, a silicon oxide layer 2225 is formed over the metal layer 630.

Step B

Figure 4B:
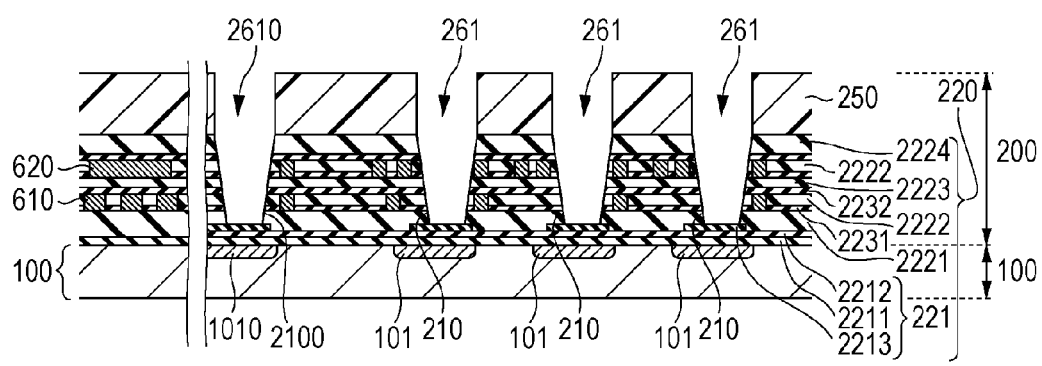
Figure 5B:
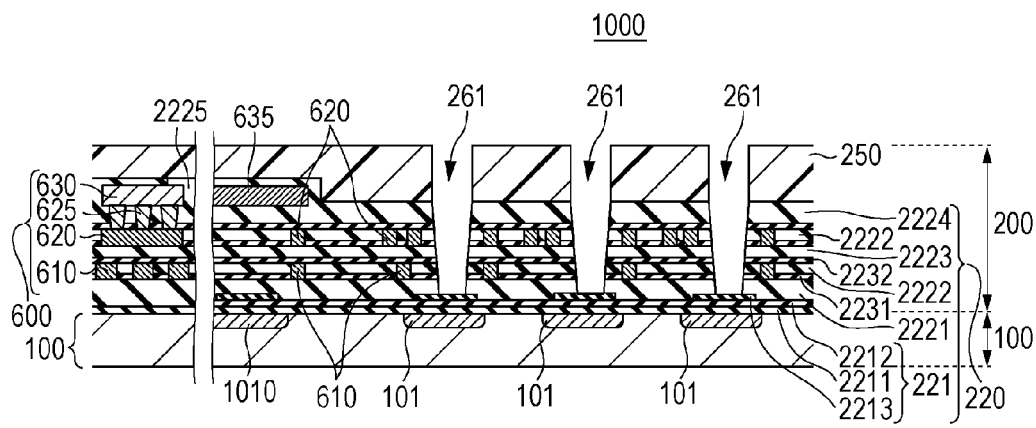

FIGS. 4B and 5B each illustrate step B. Step B is one of steps of forming light-guiding members 210.

A mask 250 having a predetermined pattern and made of a photoresist or the like is formed on the base portion 220 by a known photolithographic technique. Subsequently, the silicon oxide layers 2221, 2222, 2223, and 2224 and the silicon nitride layers 2231 and 2232 are etched through the mask 250. In this manner, a plurality of openings 261 are provided above the photoelectric conversion region. Subsequently, the mask 250 is removed.

In the first embodiment illustrated in FIG. 4B, a dummy opening 2610 is also provided above the dummy photoelectric conversion portion 1010.

In the second embodiment illustrated in FIG. 5B, since the metal layer 630 is covered with the silicon oxide layer 2225, the metal layer 630 is protected from the effects of asking or the like performed in the removal of the mask 250.

Step C

Figure 4C:
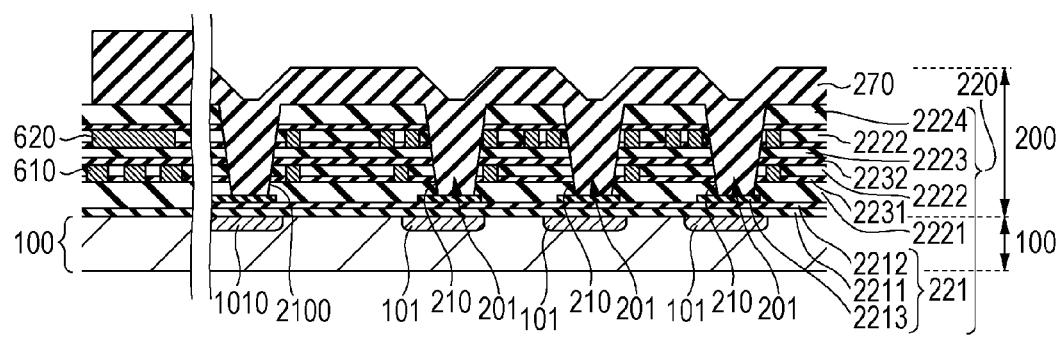
Figure 5C:
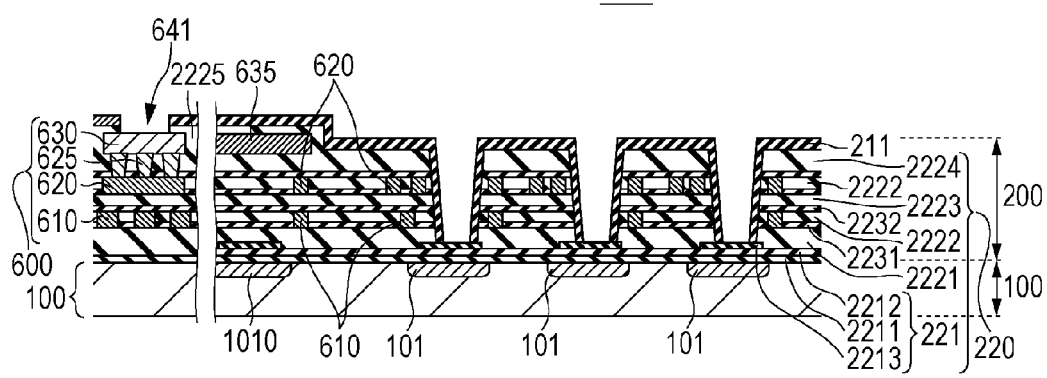

FIGS. 4C and 5C each illustrate step C. Step C is another one of the steps of forming light-guiding members 210.

In the first embodiment illustrated in FIG. 4C, a filler member 270 that fills the openings 261 and the dummy opening 2610 is formed. The filler member 270 may be formed as a silicon nitride film by, for example, high-density plasma chemical vapor deposition (CVD).

In the second embodiment illustrated in FIG. 5C, a silicon nitride layer 211 as a protective layer is formed over the inner surfaces of the openings 261 and the dummy opening 2610. For example, the silicon nitride layer 211 is formed by plasma CVD at a substrate temperature of 300° C. to 500° C., at a gas pressure of 1 Torr to 10 Torr, and with a high-frequency power of 500 W to 1000 W. In the peripheral region, the silicon nitride layer 211 and the silicon oxide layer 2225 are etched in that order, whereby an opening 641 in which the metal layer 630 is exposed is provided. Subsequently, a hydrogen termination process (hydrogen alloy process) is performed in which the resultant body is heated in a hydrogen atmosphere. After this heating process, the temperature never becomes higher than the temperature that is reached during the heating process. In the peripheral region, the silicon nitride layer 211 functions as a passivation film.

Step D

Figure 4D:
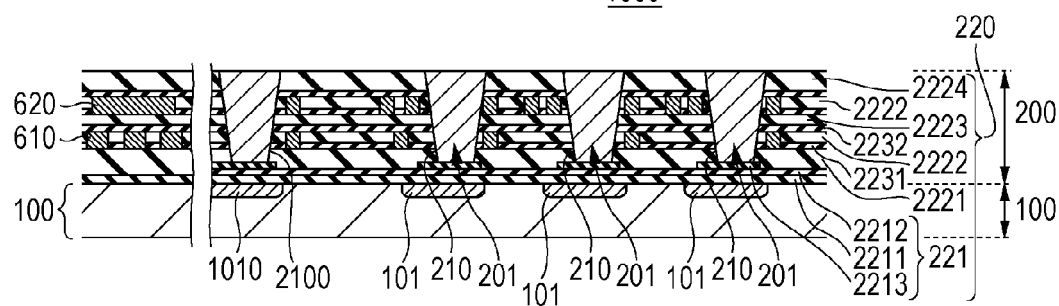
Figure 5D:
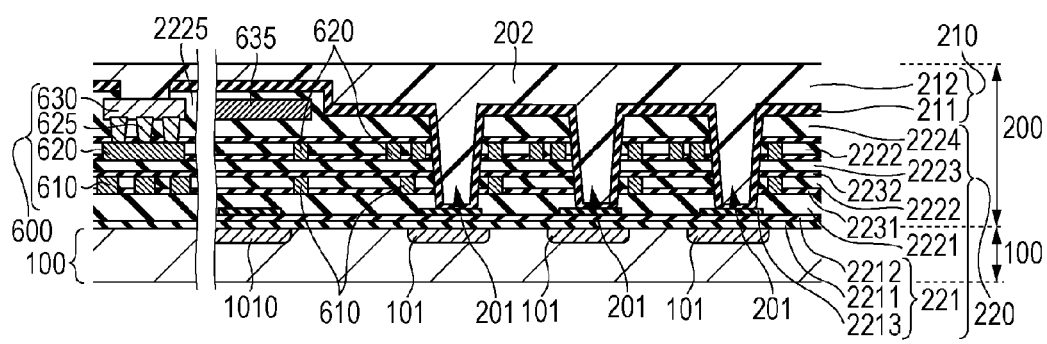

FIGS. 4D and 5D each illustrate step D. Step D is yet another one of the steps of forming light-guiding members 210. If there are variations in the upper surfaces of the light-guiding members 210 corresponding to different photoelectric conversion portions 101, interference patterns may be produced by the difference in the optical path length between beams reflected by the various upper surfaces of the light-guiding members 210, leading to nonuniformity in the brightness or the color of the resulting image. Therefore, the upper surfaces of the light-guiding members 210 are to be made as planar as possible.

In the first embodiment illustrated in FIG. 4D, excessive portions of the filler member 270 are removed by etching or chemical mechanical polishing (CMP). The excessive portions of the filler member 270 may be removed while the upper surface of the filler member 270 is planarized by CMP. In the first embodiment, the filler member 270 is scraped until the silicon oxide layer 2224 forming the upper surface of the base portion 220 is exposed. Thus, the upper surface of the base portion 220 and the upper surfaces of a plurality of light-guiding members 210 in combination form a planar surface. Alternatively, the filler member 270 may be left on the base portion 220 such that a light-guiding member 210 having a continuous planar upper surface extending over the entirety of the photoelectric conversion region.

In the second embodiment illustrated in FIG. 5D, a resin material as a resin layer 212 that fills the openings 261 is provided by an application method such as spin coating, whereby a light-guiding member 210 including the silicon nitride layer 211 and the resin layer 212 is formed. According to an application method, since the material applied to a target surface flows, a light-guiding member 210 can have a more planar upper surface than the surface of the base portion 220 having some irregularities. An additional planarization process based on a reflow method, an etch-back method, or the like may be performed on the light-guiding member 210.

Step E

Figure 4E:
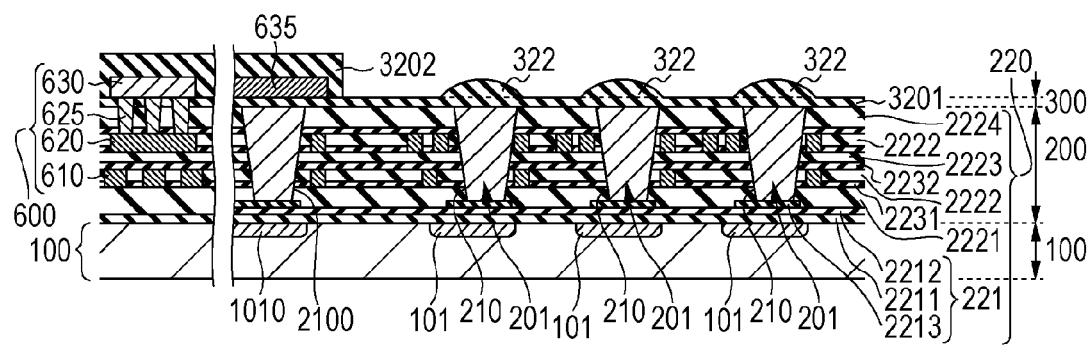
Figure 5E:
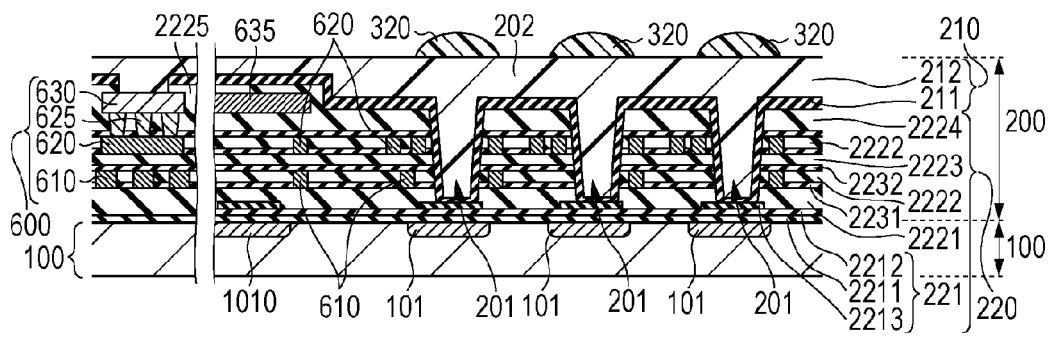

FIGS. 4E and 5E each illustrate step E. In step E, a convex member 320 is formed.

In the first embodiment illustrated in FIG. 4E, a silicon oxide layer 3201 is formed over the light-guiding members 210 and the base portion 220. Subsequently, via holes extending through the silicon oxide layer 3201, the silicon oxide layer 2224, and the silicon nitride layer 2232 and reaching the second wire layer 620 are provided, and via plugs 625 are embedded in the respective via holes. Subsequently, a metal layer 630 to be connected to the via plugs 625 is formed on the silicon oxide layer 3201. Simultaneously, a light-shielding member 635 is formed over a dummy light-guiding member 2100. Furthermore, a silicon oxide layer 3202 is formed on the silicon oxide layer 3201 in such a manner as to cover the metal layer 630. The silicon oxide layers 3201 and 3202 function as material layers that are to form a convex member 320. Subsequently, a member having plano-convex lenses is formed on the silicon oxide layer 3202. Exemplary methods of forming the pattern include the following. In gray-scale exposure, photosensitive resin is exposed to light while the exposure value is changed gradually, and the photosensitive resin thus exposed to light is developed, whereby a surface shape defined by the gradation of exposure values is obtained. In a reflow method, resin is made to flow on a surface so that an intended surface shape is obtained by utilizing an effect of surface tension. In the peripheral region, the silicon oxide layers 3202 and 3201 are covered with the resin layer provided in forming the above pattern. The pattern is transferred to the silicon oxide layer 3202 by an etch-back method, whereby a convex member 320 including plano-convex lenses having respective convex surfaces is formed. Although only the silicon oxide layer 3202 forms the convex surfaces of the convex member 320 in this case, the silicon oxide layer 3202 and the silicon oxide layer 3201 in combination may form the convex surfaces of the convex member 320. Although portions of the silicon oxide layer 3201 residing between the convex surfaces are left as connecting portions that connect the convex surfaces (convexities 322) to one another in the above case, a plurality of convex members 320 that are separate from one another may alternatively be formed by processing the silicon oxide layers 3202 and 3201 until the silicon oxide layer 2224 provided therebelow is exposed. In the peripheral region, since the silicon oxide layer 3202 is covered with the resin layer provided in forming the pattern, the silicon oxide layer 3202 remains unprocessed and forms a silicon oxide layer 2225 functioning as an insulating layer that covers the metal layer 630. Unnecessary portions of the member having the plano-convex lenses such as the resin layer provided in forming the convex member 320 are removed.

The method according to the first embodiment illustrated in FIG. 4E is also applicable to the method according to the second embodiment illustrated in FIG. 5E. If the light-guiding member 210 includes resin (the resin layer 212), however, it may be inappropriate to heat the light-guiding member 210 to a temperature exceeding the heat-resistant temperature of the light-guiding member 210 after the light-guiding member 210 is formed. This is because the heat may change the quality of the resin included in the light-guiding member 210 and cause deterioration such as devitrification or decolorization, or may produce defects such as voids or cracks. For example, if siloxane resin is heated to about 400° C., defects such as voids or cracks may be produced in the siloxane resin. The step of forming convex members 320 is accompanied by heating. If a base member for convex members 320 is formed at a temperature below the heat-resistant temperature of the light-guiding member 210, the above damage caused by heat is avoided. To form the base member for convex members 320 at a low temperature, any of the following methods is available: a deposition method such as low-temperature plasma CVD, an application method such as spin coating, and so forth. To process a film deposited on a planar surface into convex members 320 each having a convex surface, etching needs to be performed. In such a case, dry etching such as plasma etching tends to be employed in general. Dry etching, however, may cause damage leading to deterioration of resin. That is, if any processing method that does not require dry etching on the light-guiding portions 201 is employed, the above damage caused by etching is avoided. As described above, in view of the thermal damage and the etching damage to the resin forming the light-guiding member 210, it may be appropriate to employ photosensitive resin as the material for convex members 320. Hence, photosensitive resin is applied onto the light-guiding member 210 by spin coating, and the photosensitive resin is patterned photolithographically, whereby convex members 320 are obtained. In this process, gray-scale exposure or a reflow method described above may be employed. In the reflow method using resin, heating is performed at a low temperature. The convex members 320 are made of, for example, a resin having a refractive index of about 1.40 to 1.60, such as styrene resin or acrylic resin.

Step F

Figure 4F:
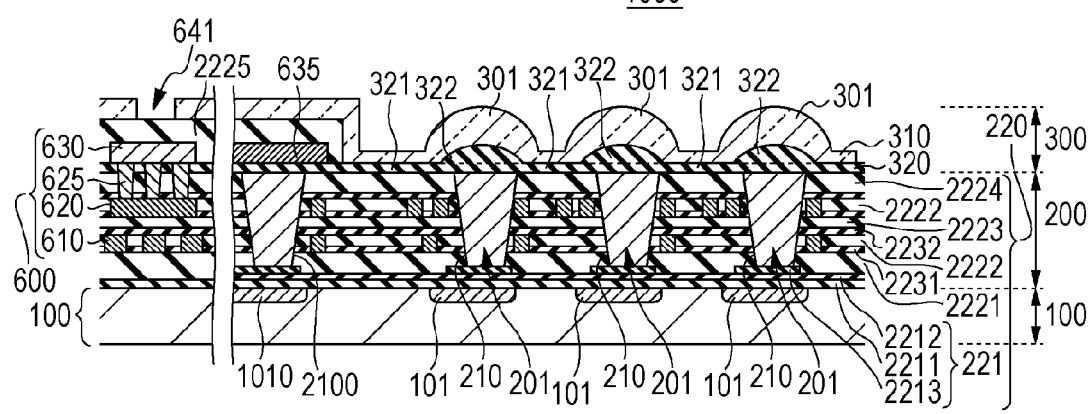
Figure 5F:
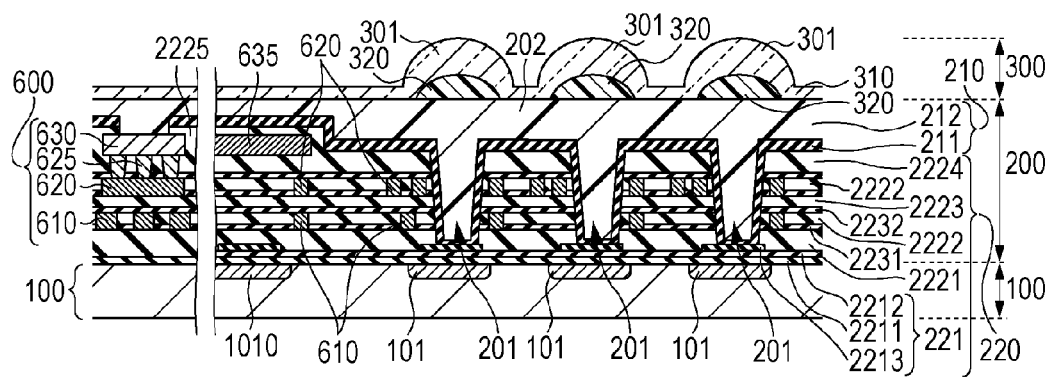

FIGS. 4F and 5F each illustrate step F. In step F, in-layer lenses 301 in the form of convex meniscus lenses are formed.

A film of a material for in-layer lenses 301 is formed on the convex member 320. The material for in-layer lenses 301 has a higher refractive index than the material for convex member 320. In step F also, it is effective to reduce the thermal damage and the etching damage described above for step E.

The material for in-layer lenses 301 illustrated in each of FIGS. 4F and 5F is silicon nitride. A film of silicon nitride is deposited by a plasma CVD method with increased anisotropy.

In the plasma CVD method with increased anisotropy, a film is not formed at a uniform deposition rate regardless of the direction of the normal to each of the convex surfaces of the convex member 320, which functions as an underlayer, but is formed at varying deposition rates in accordance with the direction of the normal to each of the convex surfaces of the convex member 320. If the convex member 320 is formed such that the deposition rate is high at and around the top of each convex surface of the convex member 320 and becomes lower from a middle portion to the base, the convex member 320 has convex meniscus lenses. To increase anisotropy in plasma CVD, it is effective to adjust conditions for film formation including the flow rate of the material, power, pressure, bias, and so forth. It is also effective to adjust the configuration of the CVD apparatus, for example, the positions of and the distance between the material-gas-supplying nozzle and the semiconductor substrate in the chamber of the CVD apparatus. Anisotropy is higher at a high plasma density, a high pressure (atmospheric pressure), or a small bias than at a low plasma density, a low pressure, or a large bias. If the thermal damage to the light-guiding members 210 is small as in the first embodiment illustrated in FIG. 4F, thermal CVD may be employed instead of plasma CVD. In the second embodiment illustrated in FIG. 5F in which the light-guiding member 210 includes the resin layer 212, the temperature at which the in-layer lenses 301 are formed may be below the heat-resistant temperature of the resin layer 212. If siloxane resin is employed as the material for the resin layer 212, the in-layer lenses 301 may be formed at a temperature of, for example, 350° C. or below, or preferably 300° C. or below. If plasma CVD is employed, the in-layer lenses 301 are formed under the following conditions, for example: a substrate temperature of 150° C. to 350° C., a gas pressure of 1 Torr to 5 Torr, and a high-frequency power of 250 W to 750 W. According to such a method, an in-layer lens array 310 is formed by simply depositing a material for the in-layer lenses 301 on the photoelectric conversion region without performing etching. Therefore, damage to the light-guiding portions 201 and the photoelectric conversion portions 101 is reduced.

In the first embodiment illustrated in FIG. 4F, since the convex member 320 is made of silicon oxide, the in-layer lenses 301 may be made of a resin having a higher refractive index than the convex member 320. The in-layer lenses 301 in the form of convex meniscus lenses may be formed by forming a resin film on the convex member 320 by an application method and processing the resin film by a method such as etch-back or gray-scale exposure. That is, the resin film only needs to be formed in such a manner as to have convexities whose upper surfaces curve at a larger curvature than the convex surfaces (convexities 322) of the convex member 320. If the damage that may be caused by etching is negligible, the in-layer lenses 301 may be formed by depositing a material for in-layer lenses 301 containing silicon nitride on the convex member 320 and processing the deposition into a pattern of convex meniscus lenses, as in the step of forming the convex member 320 illustrated in FIG. 4E.

In the second embodiment illustrated in FIG. 5F, if the convex members 320 are to be made of a resin material, the options of possible materials having higher refractive indices than the resin material are limited. In such a case, the in-layer lenses 301 may be formed by deposition of a material having a high refractive index, such as silicon nitride or silicon oxynitride.

In each of the first and second embodiments illustrated in FIGS. 4F and 5F, a portion of the silicon nitride film forming the in-layer lens array 310 that is on the peripheral region is left so as to function as a passivation film. In the second embodiment illustrated in FIG. 5F, the silicon nitride layer 211 can also function as a passivation film. Therefore, the portion of the silicon nitride film forming the in-layer lens array 310 that is on the peripheral region may be removed. In the first embodiment illustrated in FIG. 4F, a resist is applied over the entirety of the semiconductor substrate, the resist is patterned by a known photolithographic method in such a manner as to have an opening for exposing the metal layer 630, and an opening 641 is then provided by a known etching technique. In the first embodiment illustrated in FIG. 4F, only the material layer that is to become the in-layer lenses 301 is patterned, and the silicon oxide layer 2225 that covers the metal layer 630 is not patterned. This is because the silicon oxide layer 2225 is removable when the pad opening 640 is provided after top lenses 501 are formed as to be described below. In step F, the silicon oxide layer 2225 may also be patterned, of course, such that the metal layer 630 is exposed. After the resist used in providing the opening 641 is removed, a hydrogen alloy process is performed.

Step G

Figure 4G:
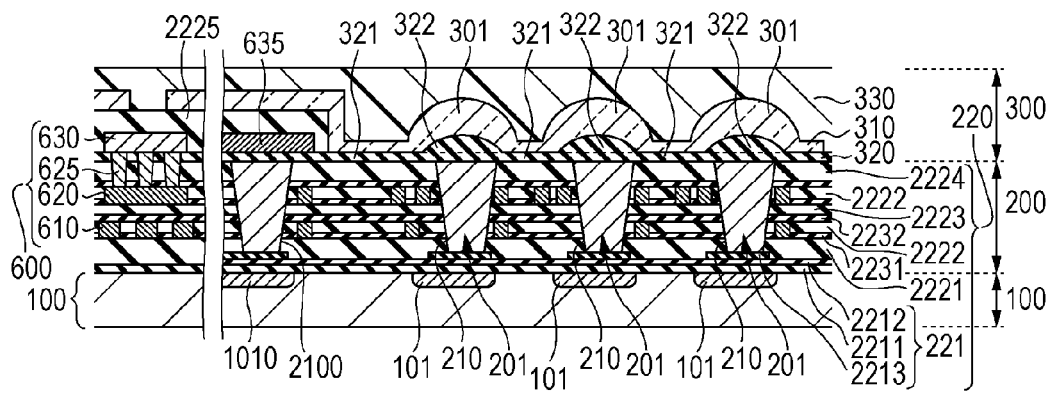
Figure 5G:
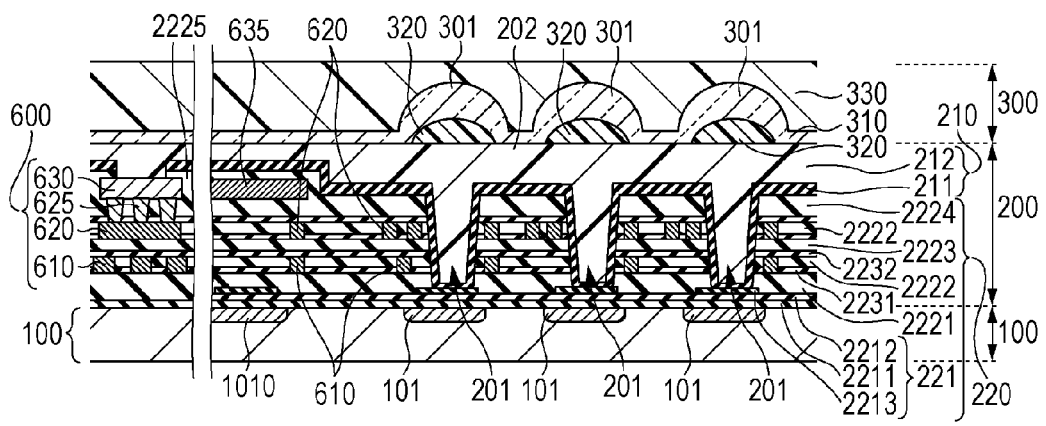

FIGS. 4G and 5G each illustrate step G. In step G, a concave member 330 is formed.

A film of a material having a lower refractive index than the in-layer lenses 301 is formed over the in-layer lenses 301. The film functions as a concave member 330. Resin is suitable as the material for the concave member 330. The material can be provided by an application method such as spin coating. If spin coating is employed, a film having a planar surface is obtained. Such planarization may alternatively be performed by a reflow or etch-back method. Particularly, in the second embodiment illustrated in FIG. 5G, considering the probability of thermal damage or etching damage, it may be appropriate that an application method is solely employed for planarization. The material for the concave member 330 may alternatively be silicon oxide. In that case, silicon oxide may be provided by an application method such as a spin-on-glass (SOG) method. Particularly, if a deposition method is employed, planarization is desired to be performed. The planarization may be performed by CMP or an etch-back method, although not only the etch-back method but also CMP tends to give some mechanical damage, equivalent to etching damage, to the light-guiding member 210. Hence, it is considered to be appropriate to form the concave member 330 by an application method.

Step H

Figure 4H:
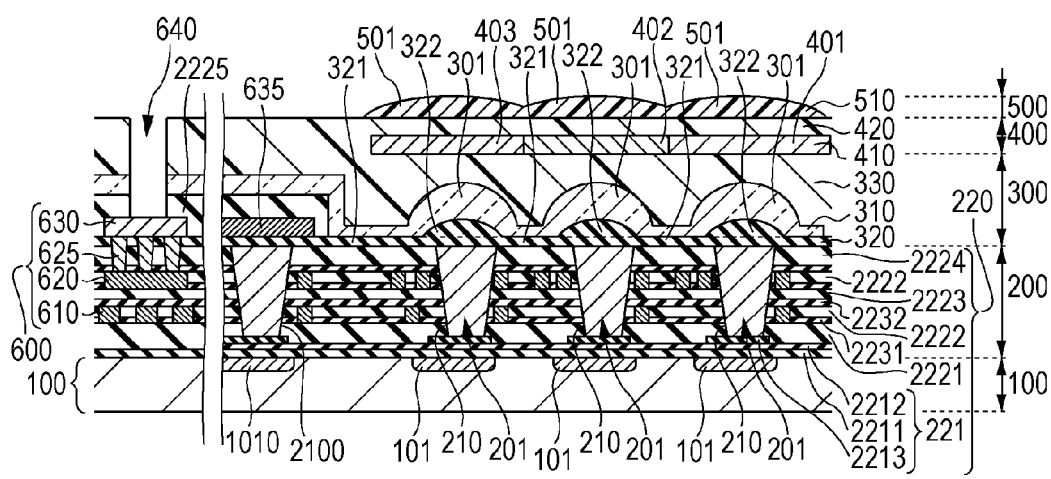
Figure 5H:
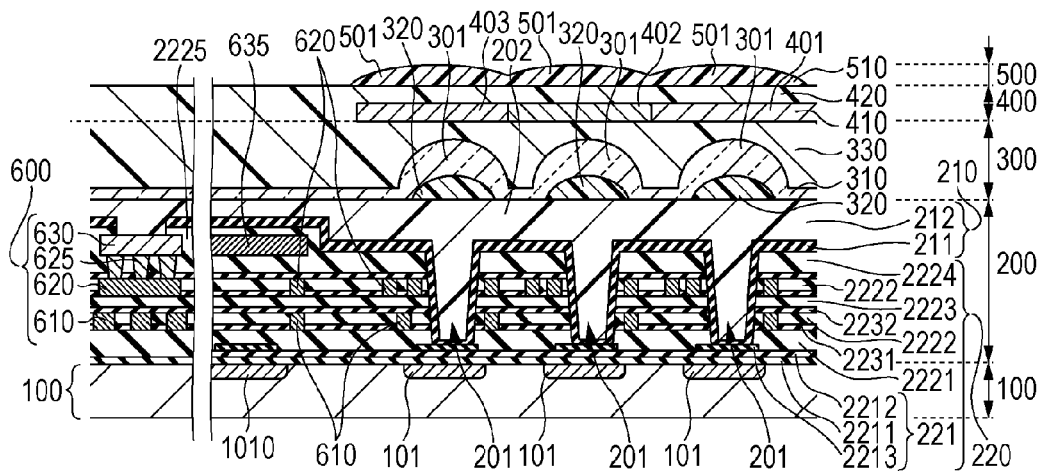

FIGS. 4H and 5H each illustrate step H. In step H, a filter unit 400 and a second light-condensing unit 500 are formed.

A color filter array 410 is formed by using a known photosensitive color resist, and a coating 420 is provided for planarization by an application method. Subsequently, a top lens array 510 is formed on the coating 420. The top lens array 510 may be formed by gray-scale exposure, a reflow method, an etch-back method, or the like, as in the step of forming the convex member 320. The top lenses 501 may be made of a photosensitive resin or the same material as for the convex member 320. A medium provided above the top lenses 501 is typically air, which has a refractive index of 1.00. Even if the top lenses 501 have a refractive index of about 1.60 unlike the in-layer lenses 301, the top lenses 501 are capable of fully condense light. After forming the top lenses 501, a pad opening 640 is provided by a known photolithographic technique and a known etching technique such that the metal layer 630 is exposed. In the first embodiment illustrated in FIG. 4H, portions of the coating 420 for planarization, the concave member 330, and the silicon oxide layer 3202 are etched off. In the second embodiment illustrated in FIG. 5H, portions of the coating 420, the concave member 330, the layer provided in forming the in-layer lenses 301, and the resin layer 212 are etched off, whereby a pad opening 640 (not illustrated) is provided as in the first embodiment illustrated in FIG. 4H.

Thus, the photoelectric conversion apparatus 1000 is manufactured. As described above, if resin is employed as the material for the light-guiding members 210, careful consideration needs to be given for the steps to be performed after the formation of the light-guiding members 210 so that thermal damage and etching damage that may occur in the resin is reduced as much as possible. Particularly, it is appropriate to form the first light-condensing unit 300, to be provided near the light-guiding members 210, by an application method or a low-temperature deposition method. As a method of processing a film into convex meniscus lenses, patterning with light or anisotropic deposition is suitable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-176028 filed Aug. 8, 2012, which is hereby incorporated by reference herein in its entirety.

What is claimed is:

1. A photoelectric conversion apparatus comprising:
   a photoelectric conversion region having a plurality of photoelectric conversion portions; and
   a lens array provided above the photoelectric conversion region,
   wherein the lens array includes a plurality of convex meniscus lenses,
   wherein each of the convex meniscus lenses is provided between a first member and a second member, the first member having a lower refractive index than one of the convex meniscus lenses and having a convex surface conforming to a concave surface of the one of the convex meniscus lenses, the second member having a lower refractive index than the one of the convex meniscus lenses and having a concave surface conforming to a convex surface of the one of the convex meniscus lenses,
   wherein the first member is provided between the one of the convex meniscus lenses and one of the photoelectric conversion portions, and
   wherein a projected area of the convex surface of the one of the convex meniscus lenses is larger than a projected area of the concave surface of the one of the convex meniscus lenses.

2. The photoelectric conversion apparatus according to claim 1, further comprising a plurality of light-guiding paths provided between the lens array and the photoelectric conversion region.

3. The photoelectric conversion apparatus according to claim 1, wherein the refractive index of the first member is higher than or equal to the refractive index of the second member.

4. The photoelectric conversion apparatus according to claim 1, wherein a surface of the second member that is opposite a surface thereof facing the one of the convex meniscus lenses is more planar than the concave surface of the second member.

5. The photoelectric conversion apparatus according to claim 1, wherein the convex surface of the one of the convex meniscus lenses borders a convex surface of another one of the convex meniscus lenses.

6. The photoelectric conversion apparatus according to claim 1, wherein the concave surface of the one of the convex meniscus lenses is spaced apart from a concave surface of an adjacent one of the convex meniscus lenses.

7. The photoelectric conversion apparatus according to claim 1, further comprising a second lens array provided farther from the photoelectric conversion region than the lens array, the second lens array including a plurality of convex lenses,
wherein a curvature of the convex surface of the one of the convex meniscus lenses is larger than a curvature of a convex surface of one of the convex lenses.

8. The photoelectric conversion apparatus according to claim 1,
wherein the first member and the second member are each made of resin, and
wherein the one of the convex meniscus lenses are made of at least one of silicon nitride and silicon oxynitride.

9. The photoelectric conversion apparatus according to claim 8, further comprising a third member having a higher refractive index than the first member and provided between the first member and the photoelectric conversion portions,
wherein the third member is made of resin.

10. A photoelectric conversion apparatus comprising:
a photoelectric conversion region having a plurality of photoelectric conversion portions;
a lens array provided above the photoelectric conversion region and including a plurality of convex meniscus lenses;
a first member having a lower refractive index than one of the convex meniscus lens and having a convex surface conforming to a concave surface of the one of the convex meniscus lenses;
a second member having a lower refractive index than the one of the convex meniscus lens and having a concave surface conforming to a convex surface of the one of the convex meniscus lenses; and
a third member having a higher refractive index than the first member and provided between the first member and one of the photoelectric conversion portions,
wherein the first member is provided between the convex meniscus lens and the one of the photoelectric conversion portions.

11. The photoelectric conversion apparatus according to claim 10, wherein the third member is made of resin.

12. A photoelectric conversion apparatus comprising:
a photoelectric conversion region having a plurality of photoelectric conversion portions; and
a lens array provided above the photoelectric conversion region,
wherein the lens array includes a plurality of convex meniscus lenses,
wherein each of the convex meniscus lenses is provided between a first member and a second member, the first member having a lower refractive index than one of the convex meniscus lenses and having a convex surface conforming to a concave surface of the one of convex meniscus lenses, the second member having a lower refractive index than the one of the convex meniscus lenses and having a concave surface conforming to a convex surface of the one of the convex meniscus lenses,
wherein the first member is provided between the one of the convex meniscus lenses and one of the photoelectric conversion portions, and
wherein the first member and the second member are each made of resin.

13. The photoelectric conversion apparatus according to claim 12, wherein a projected area of the convex surface of the one of the convex meniscus lenses is larger than a projected area of the concave surface of the one of the convex meniscus lenses.

14. The photoelectric conversion apparatus according to claim 12, wherein the convex meniscus lenses are made of at least one of silicon nitride and silicon oxynitride.

15. A photoelectric conversion apparatus comprising:
a photoelectric conversion region having a plurality of photoelectric conversion portions;
a first lens array provided above the photoelectric conversion region; and
a second lens array provided farther from the photoelectric conversion region than the first lens array,
wherein the first lens array includes a plurality of convex meniscus lenses,
wherein each of the convex meniscus lenses is provided between a first member and a second member, the first member having a lower refractive index than one of the convex meniscus lenses and having a convex surface conforming to a concave surface of the one of the convex meniscus lenses, the second member having a lower refractive index than the one of the convex meniscus lenses and having a concave surface conforming to a convex surface of the convex meniscus lenses,
wherein the first member is provided between the one of the convex meniscus lenses and one of the photoelectric conversion portions, and
wherein a third member having a higher refractive index than the first member is provided between the first member and the one of the photoelectric conversion portions.

16. The photoelectric conversion apparatus according to claim 15, wherein the third member provides a plurality of light-guiding paths.

17. The photoelectric conversion apparatus according to claim 15,
wherein the second lens array includes a plurality of convex lenses, and
wherein a curvature of the convex surface of the one of the convex meniscus lenses is larger than a curvature of a convex surface of one of the convex lenses.

18. The photoelectric conversion apparatus according to claim 15, wherein a surface of the second member that is opposite a surface thereof facing the one of the convex meniscus lenses is more planar than the concave surfaces of the second member.

19. The photoelectric conversion apparatus according to claim 15,
wherein the first member and the third member are each made of resin, and wherein one of the convex meniscus lenses is made of at least one of silicon nitride and silicon oxynitride.

20. The photoelectric conversion apparatus according to claim 15,
wherein the third member is made of resin in which inorganic particles are diffused, the inorganic particles having a higher refractive index than the resin.

* * * * *